(12) United States Patent
Poon et al.

(10) Patent No.: US 7,483,247 B2
(45) Date of Patent: Jan. 27, 2009

(54) MULTI-STACK POWER SUPPLY CLAMP CIRCUITRY FOR ELECTROSTATIC DISCHARGE PROTECTION

(75) Inventors: Steven S. Poon, Sunnyvale, CA (US); Timothy J. Maloney, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/734,531

(22) Filed: Apr. 12, 2007

(65) Prior Publication Data

US 2007/0183106 A1 Aug. 9, 2007

Related U.S. Application Data

(63) Continuation of application No. 10/954,860, filed on Sep. 30, 2004, now Pat. No. 7,230,806.

(51) Int. Cl.
*H02H 9/00* (2006.01)
*H02H 3/22* (2006.01)
*H02H 7/12* (2006.01)
*H02H 1/00* (2006.01)
*H02H 1/04* (2006.01)
*H02H 9/06* (2006.01)
*H02H 3/20* (2006.01)
*H02H 9/04* (2006.01)

(52) U.S. Cl. .................. 361/56; 361/111; 361/118; 361/91.1

(58) Field of Classification Search ............... None
See application file for complete search history.

(56) References Cited

U.S. PATENT DOCUMENTS 5,907,464 A 5/1999 Maloney et al.
5,956,219 A 9/1999 Maloney
6,563,372 B1* 5/2003 Fournel .................. 327/543
6,806,516 B2* 10/2004 Negishi et al. .......... 257/203
6,867,956 B2 3/2005 Clark et al.
7,050,282 B2 5/2006 Chuang et al.
2002/0105510 A1* 8/2002 Tsuchiya ................. 345/211
2002/0131221 A1 9/2002 Lien et al.
2003/0072116 A1 4/2003 Maloney et al.
2003/0222285 A1 12/2003 Negishi et al.

OTHER PUBLICATIONS

Written Opinion for PCT/US2005/035421 mailed Feb. 13, 2006.
International Search Report for PCT/US2005/035421 mailed Feb. 13, 2006.
"White Paper ESD Phenomena and the Reliability for Microelectronics" ElectroStatic Discharge Association, 2002.

(Continued)

*Primary Examiner*—Stephen W Jackson
*Assistant Examiner*—Dharti H Patel
(74) *Attorney, Agent, or Firm*—Marshall, Gerstein & Borun LLP

(57) ABSTRACT

A multi-stack power supply clamp circuit for providing electrostatic discharge (ESD) protection to enhance performance of advanced submicron processes is provided. The clamp circuit includes a bias voltage generator with low leakage and high current drive capabilities, and means to lighten current load on the voltage generator through reduced gate leakage. The bias voltage generator includes a differential amplifier. The multi-stack clamp circuit provides voltage-tolerant ESD protection with optimized leakage, reduced sensitivity to operating conditions, and tolerance of increased gate current in new process technologies.

19 Claims, 12 Drawing Sheets

OTHER PUBLICATIONS

T.J. Maloney, "Designing Power Supply Clamps for Electrostatic Discharge Protection of Integrated Circuits", Microelectronics Reliability 38, No. 11, pp. 1691-1703 (Nov. 1998).

T.J. Maloney and W. Kan, "Stacked PMOS Clamps for High Voltage Power Supply Protection", 1999 EOS/ESD Symposium Proceedings, pp. 70-77.

S.S. Poon and T.J. Maloney, "New Considerations for MOSFET Power Clamps", 2002 EOS/ESD Symposium Proceedings, pp. 1-5.
M. Bazes, "Two Novel Fully Complementary Self Biased CMOS Differential Amplifiers", IEEE J. Solid-State Circuits, vol. 26, No. 2, pp. 165-168, Feb. 1991.
S. Thompson, P. Packan, and M. Bohr, "MOS Scalling Transistor Challenges for the 21st Century", Intel Technology Journal, http://developer.intel.com/technology/itj/q31998.htm (Q3 1998).

* cited by examiner

MULTI-STACK POWER SUPPLY CLAMP CIRCUITRY FOR ELECTROSTATIC DISCHARGE PROTECTION

CROSS-REFERENCE TO RELATED APPLICATION

This is a continuation of application Ser. No. 10/954,860 filed on Sep. 30, 2004, which is incorporated herein by reference.

TECHNICAL FIELD

This patent relates generally to electrostatic discharge protection systems and more particularly to protection circuitry for sinking current during an electrostatic discharge.

BACKGROUND

Electrostatic discharge (ESD) refers to the phenomenon of electrical discharge of high current for a short time duration resulting from a build up of static charge on a particular integrated circuit package, or on a nearby human handling that particular IC package. ESD events can have serious detrimental effects on manufacture and performance of integrated circuits (ICs) and other microelectronic devices, systems that contain such devices and manufacturing facilities that produce them. Advances in silicon process technology have led to the development of increasingly smaller sizes for transistors in integrated circuits. In turn, the decreasing size of transistors has made the circuits increasingly susceptible to damage from ESD events.

As we enter the new millennium, the electronic industry continues to scale microelectronic structure to achieve faster devices, new devices, and more per unit area. ESD continues to be a threat for scaled structures produced using various new technologies used in the electronic industry, such as, submicron device technologies, high system operation speeds, higher levels of factory automation, etc. As integrated circuit devices increase in density and their operating supply voltages decrease, the integrated circuits become more sensitive to the effects of ESD. Especially, ESD is a serious problem for semiconductor devices since it has the potential to destroy an entire IC. Because ESD events occur often across the silicon circuits attached to IC package terminals, circuit designers have concentrated their efforts on developing adequate protection mechanisms for these sensitive circuits.

One solution is the use of a grounded gate transistor as a simple ESD protection circuit. The transistor is configured as a diode and has a drain junction breakdown voltage lower than the gate dielectric breakdown voltage. While this circuit provides some protection from ESD events, an ESD protection circuit should also be able to protect an IC against static discharge by non-destructively passing large currents through a low impedance path in a short time.

Electronic circuits known as power supply clamps have long served the function of protecting power rails during ESD events. FIG. 1 illustrates a block diagram of an exemplary integrated circuit which is well known to one of ordinary skill in the art. FIG. 1 shows an integrated circuit 10 which has a voltage supply input connection 12 for receiving an externally provided high supply voltage from supply circuit 14. An ESD protection circuit 16 is provided to protect internal circuitry 18, designed to perform a predetermined function, from an electrostatic discharge. The ESD protection circuit 16 is described in detail below. The integrated circuit 10 can be any type of integrated circuit which receives a supply voltage, including, but not limited to, processors, controllers, memory devices, application specific integrated circuits (ASIC), etc.

Because certain standardized or legacy supply voltages can be high enough to cause premature failure in metal-oxide semiconductor (MOS) devices used in integrated circuits, redesigned clamp circuits are needed to provide ESD protection to high voltage pins. Such circuits, known as voltage-tolerant clamps or multi-stack claims, are able to withstand high voltages by self-generating bias voltages that are low enough for MOS devices to attach to without causing damage.

A desirable bias voltage circuit should have the characteristics of low power consumption, strong current drive, and limited degradation of the ESD performance of the clamp. Low power consumption may be defined as being negligible compared to the overall power consumption of the clamp. Strong current drive must be measured by its ability to drive large loads while keeping the bias voltage on target. On the other hand, limited degradation of ESD performance should be proven by a negligible shift in the pulse current-voltage characteristics of the clamp under various operating conditions.

FIG. 2 illustrates an exemplary prior art implementation of a voltage tolerant clamp circuit 20. The clamp circuit 20 includes a voltage divider 22 formed by devices 24 and 26 between nodes 28 and 30, a controller circuit 32 including, among other devices, a device 34, and a current sinking device 36 having current sinking device transistors 38 and 40. The transistors 38 and 40 used by the current sinking device 36 may be any of the commonly used transistors. For example, the transistors 38 and 40 of the exemplary implementation of the current sinking device 36 are p-Channel transistors.

A voltage divider of a clamp circuit, such as the voltage divider 22, generates a bias voltage or a reference voltage, and therefore, is also referred to as a reference voltage generator or a bias voltage generator. As shown in FIG. 2, the simple voltage divider 22 of the prior art is used to reduce the high supply voltage on the node 28 to a smaller voltage on the node 30. For the clamp circuit 20, the major load on the voltage divider 22 is the sub-threshold leakage through the n-channel device 34. For a resistive voltage divider, this load should be small compared to the current consumption of the divider itself in order to maintain good voltage division. This requirement is relaxed in the case of the voltage divider 22, where diode-connected p-channel devices 24 and 26 with non-linear current-voltage characteristics are used instead of resistive elements. Reasonable voltage division can be achieved when the current consumption of the voltage divider 22, defined as the current through device 26 is comparable or even less than the current consumption of a load. Because the device 34 is usually much smaller than the devices 24 and 26, and because the current consumption of the voltage divider 22 is comparable to the leakage through the device 34, the voltage divider 22 can be optimized to consume leakage current that is small compared to the total clamp leakage.

The controller circuit 32 is coupled to a control node of the current sinking device 36 such that the controller circuit 32 couples the control node to a ground potential such that a voltage drop from the control node to the ground potential is less than a threshold voltage of an n-channel transistor, such as the controller transistor 34, during an ESD event on the power supply connection 28. The operation of the controller circuit 32 is explained in further detail in U.S. Pat. No. 5,956,219, which is incorporated herein in its entirety.

One of the problems associated with using the clamp circuit 20 is that the leakage of the voltage divider 22 can only be optimized based on a particular loading condition. Whereas the sub-threshold leakage of the device 34 is a strong function of temperature and other process variation, these changes do not affect the devices in the voltage divider 22 to the same extent. In order to assure satisfactory voltage division across all reasonable usage conditions, the current drive of the voltage divider 22 has to increase to meet the worst case conditions of changes in room temperature, fast process skew, etc. Unfortunately, this may result in significant over-design, which may force current consumption of the voltage divider 22 to become a significant portion of the total clamp leakage under typical operating conditions.

Similarly, it is also desirable to have an improved voltage generation sub-circuit for overall reduction of power consumption of a clamp circuit. A prior art clamp circuit 50 disclosed in FIG. 3 attempts to address this problem by using a low-leakage voltage divider 52 buffered by an analog voltage follower 54 and followed by a controller circuit 56. In the clamp circuit 50, the voltage follower 54 provides low output resistance to drive the leakage through the controller device 56, and furthermore presents only a small load to the voltage divider 52, such that the current consumption of the voltage divider can afford to stay low. Unfortunately, for the voltage follower 54 to work effectively, the input and the output of the voltage follower 54 must differ by one threshold voltage plus an unspecified amount of voltage necessary to turn on one of the transistors in the voltage follower 54. As a result it is difficult to generate highly precise bias voltage using the clamp circuit 50. This is an increasingly important problem with the advances in circuit technology because, as the maximum voltage that transistors in ICs can withstand decreases with each process generation, precision in the voltage reference becomes more critical.

To address the above problems, it is desirable to provide an improved ESD clamp circuit where the internal bias voltage of the clamp tracks the power supply accurately over the entire range of process variations and where the clamp operates with minimal leakage current over a wide range of operating conditions.

BRIEF DESCRIPTION OF THE DRAWINGS

The present patent is illustrated by way of examples and not limitations in the accompanying figures, in which like references indicate similar elements, and in which.

DETAILED DESCRIPTION OF THE EXAMPLES

Figure 1:
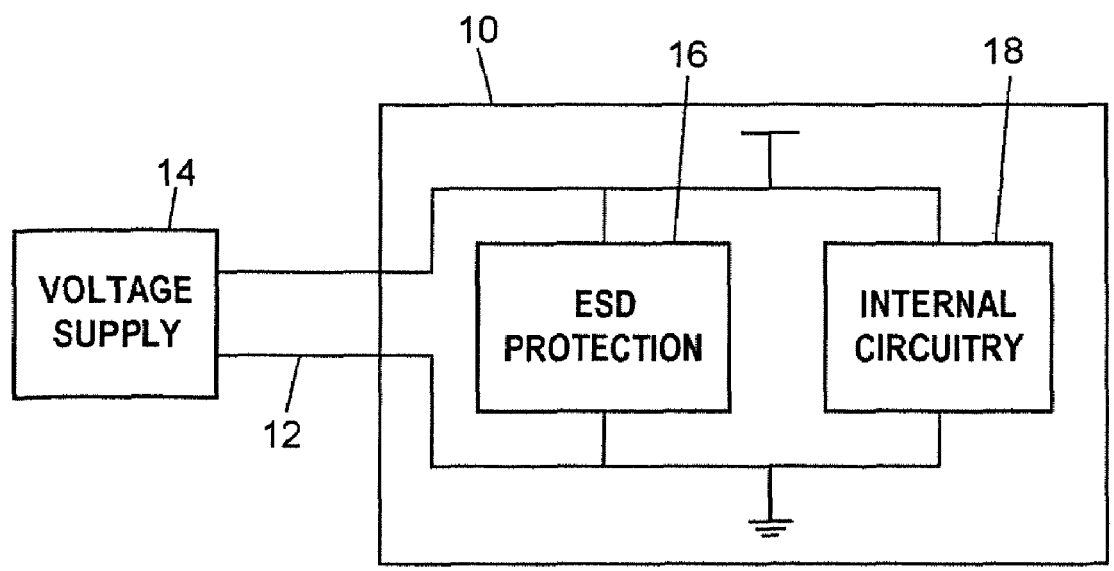
FIG. 1 illustrates a block diagram of an exemplary integrated circuit.

In the following detailed description of numerous different embodiments, reference is made to the accompanying drawings which form a part hereof, and in which is shown, by way of illustration, specific embodiments by which the present patent may be implemented. In the drawings, like numerals describe substantially similar components throughout the several views. These embodiments are described in sufficient detail to enable those skilled in the art to practice the present patent. Other embodiments may be utilized and structural, logical and electrical changes may be made without departing from the scope of the present patent. The following detailed description is therefore, not to be taken n a limiting sense and the scope of the present patent is defined only by the appended claims, along with the full scope of equivalents to which such claims are entitled.

An embodiment of the present patent illustrates a two-stack ESD clamp circuit having a differential amplifier for providing improved bias voltage. Specifically, the ESD clamp circuit includes a voltage divider, a differential amplifier, a voltage follower, a control circuit and a sinking circuit. The differential amplifier is able to set a required voltage drop across the voltage follower through a negative feedback. Thus, the gain of the differential amplifier tends to drive up the voltage follower input until the two inputs of the differential amplifier are at the same potential.

An alternate embodiment of the present patent illustrates a multi-stack ESD clamp circuit having a differential amplifier for providing improved bias voltage.

Yet another embodiment of the present patent illustrates a two-stack clamp circuit having a resistor connecting a drain of a first transistor device within a current sinking circuit of the clamp circuit with a gate of a second transistor device within the current sinking circuit, wherein the resistor allows reducing the current load on the drain of the second transistor.

Another embodiment of the present patent illustrates a two-stack clamp circuit having a pass-FET connecting a drain of a first transistor device within a current sinking circuit of the clamp circuit with a gate of a second transistor device within the current sinking circuit, wherein the pass-FET allows reducing the current load on the drain of the second transistor.

Yet another embodiment of the present patent illustrates a two-stack clamp circuit having a grounded-gate p-channel FET connecting a drain of a first transistor device within a current sinking circuit of the clamp circuit with a gate of a second transistor device within the current sinking circuit, wherein the p-channel FET allows reducing the current load on the drain of a second transistor within the current sinking circuit.

Figure 4:
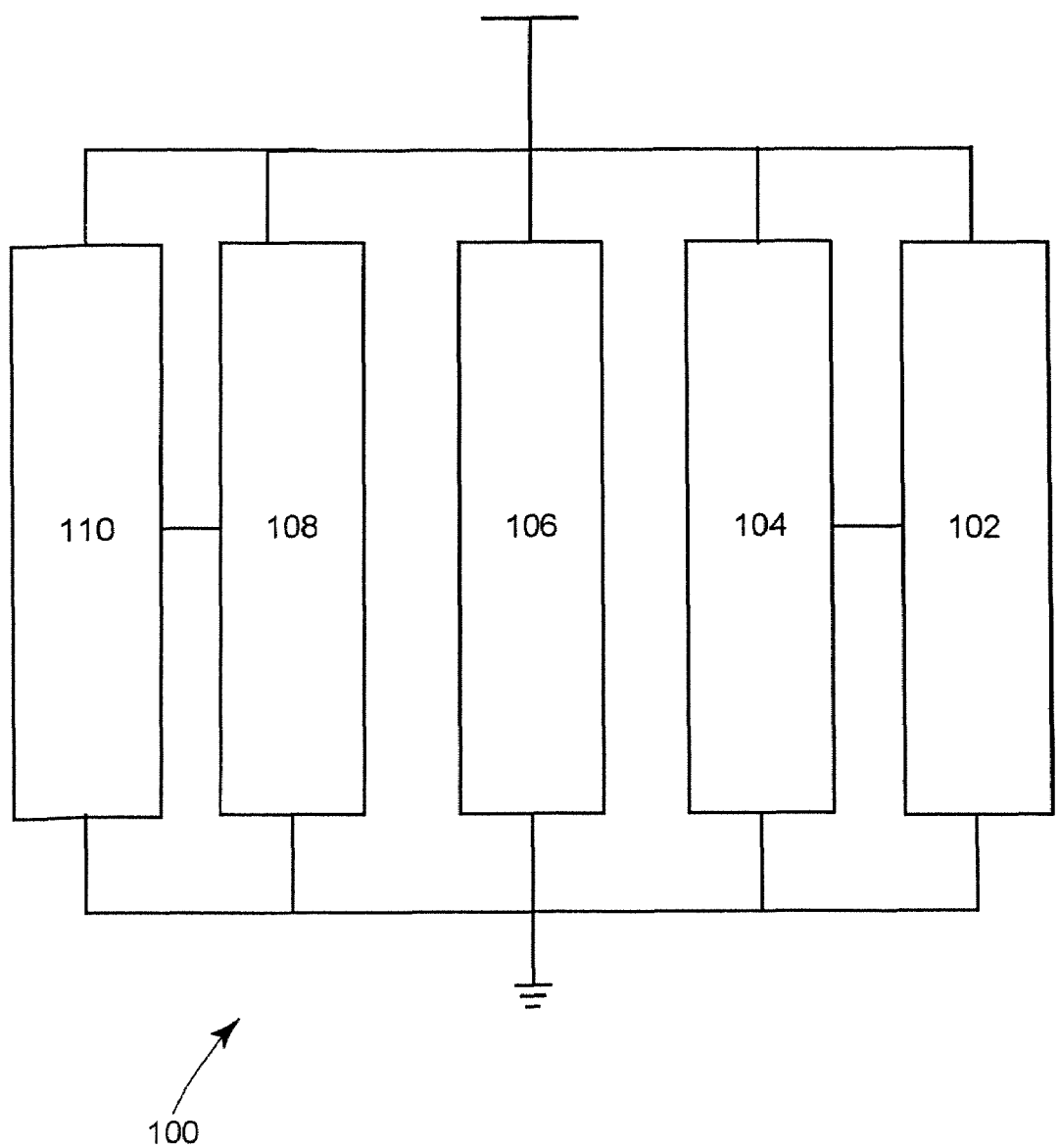
FIG. 4 illustrates a block diagram of a two-stack clamp circuit with improved bias voltage generation.

Now referring to the accompanying figures, FIG. 4 illustrates a block diagram of an exemplary two-stack clamp circuit 100 with improved bias voltage generation. The clamp circuit 100 includes a voltage divider 102, connected via a differential amplifier 104 to a voltage follower 106, which in turn is connected to a controller circuit 108 controlling a current sinking device 110. A specific implementation of the two-stack clamp circuit 100 is illustrated in further detail in FIG. 5.

Figure 5:
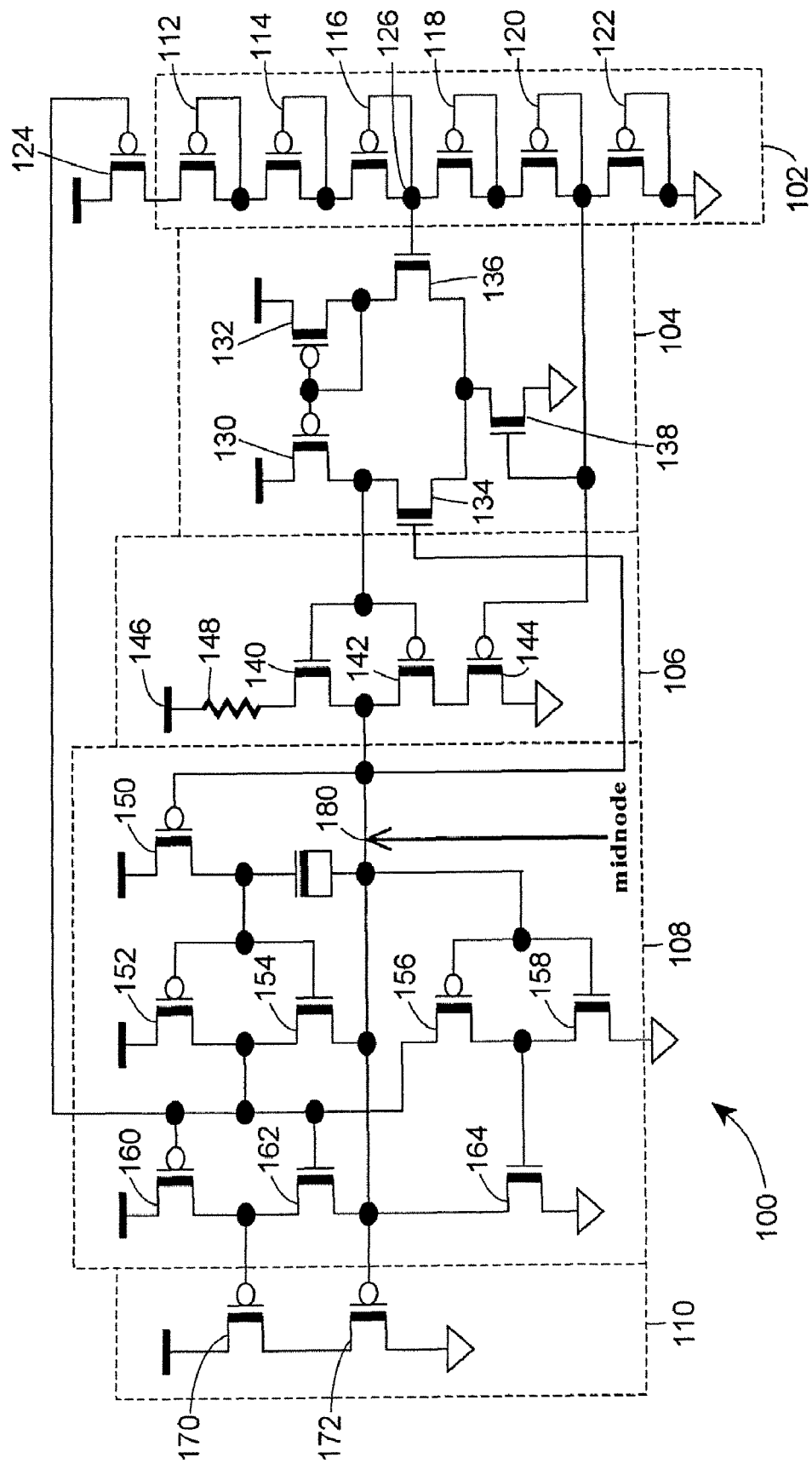
FIG. 5 illustrates an exemplary circuit diagram of the two-stack clamp circuit of FIG. 4.

Specifically referring to FIG. 5, the voltage divider 102 is a low-leakage voltage divider that includes series transistors 112 to 122, and is connected to voltage supply via a pass gate transistor 124. The voltage divider 102 provides a reference or bias voltage to the differential amplifier 104 at a bias point 126.

The differential amplifier 104 includes transistors 130 to 138. The differential amplifier 104 tends to drive up the input to the voltage follower 106 until inputs to the transistors 134 and 136 are at the same potential. Thus the differential amplifier 104 sets a required voltage drop across the voltage follower 106 through negative feedback. Generally the voltage divider 102 and the voltage follower 106 require only a small amount of leakage current, therefore, to keep the overall current consumption of the clamp circuit 100 to a low amount, it is necessary that the current consumption of the differential amplifier 104 is also kept to a low level.

The two-stack clamp circuit 100 achieves a low level current through the differential amplifier 104 by biasing the gate of the transistor 138 at a low voltage. The low bias voltage at the gate of the transistor 138 can be taken from any of the various nodes provided by the transistors 112 to 122 of the voltage divider 102. To ensure that the loading in the transistor 138 caused by the gate leakage does not disturb the voltage reference provided by the voltage divider 102, the transistor 138 can be made of a relatively small size. The lower amount of current through the differential amplifier 104 also reduces the speed of the differential amplifier 104. Moreover, the differential amplifier 104 only needs to provide a DC voltage reference, therefore, the reduction in switching speed of the differential amplifier 104 is generally not a concern. However, the gain of the differential amplifier 104 affects the precision of the voltage reference provided by the differential amplifier 104, therefore, the gain of the differential amplifier 104 is a main target of optimization. Through various simulations, it has been shown that an acceptable level of gain for the differential amplifier 104 can be achieved at levels that are small compared to the total clamp leakage of the clamp circuit 100.

Figure 2:
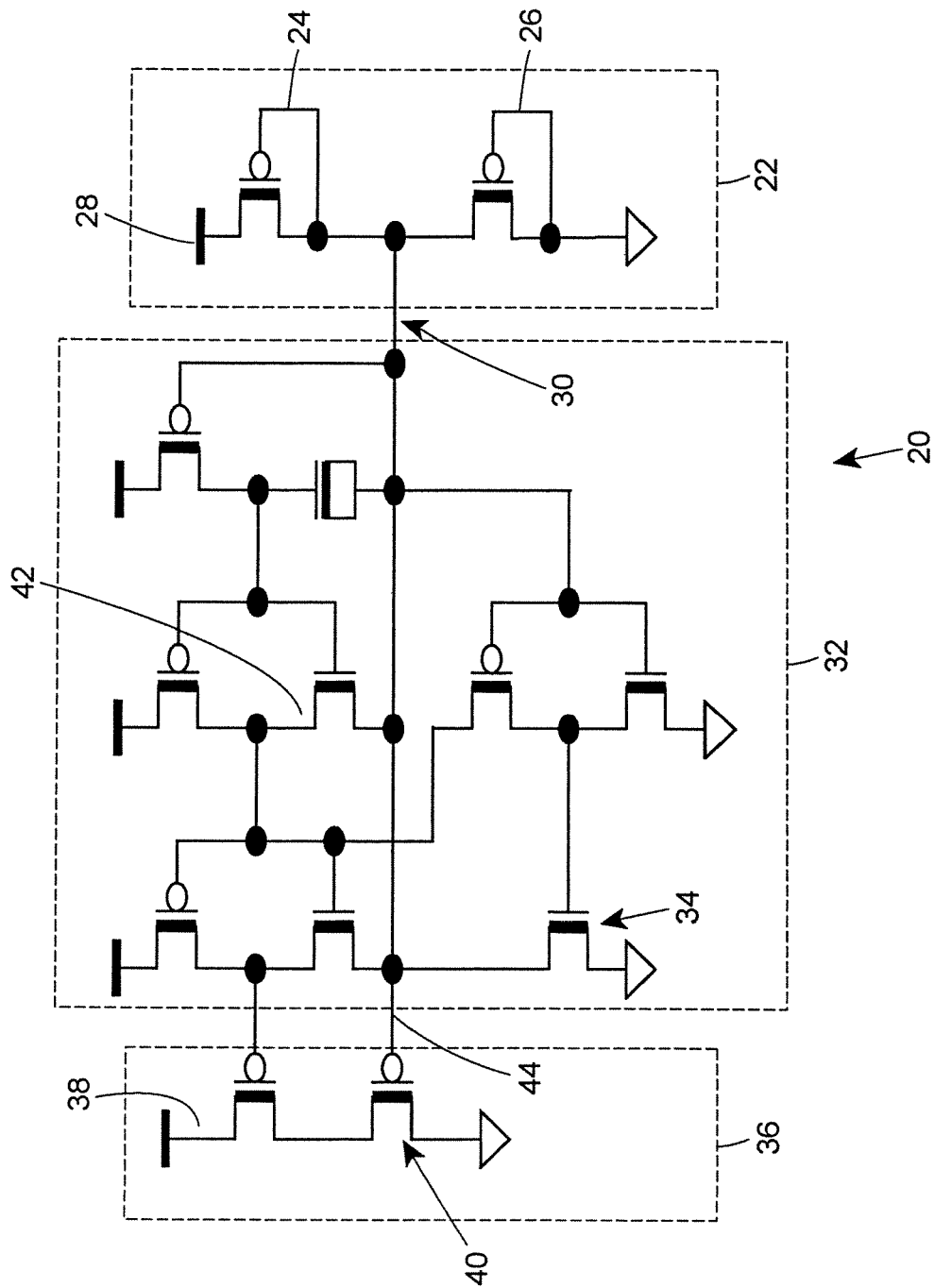
FIG. 2 illustrates an exemplary prior art implementation of a voltage tolerant clamp circuit.
Figure 3:
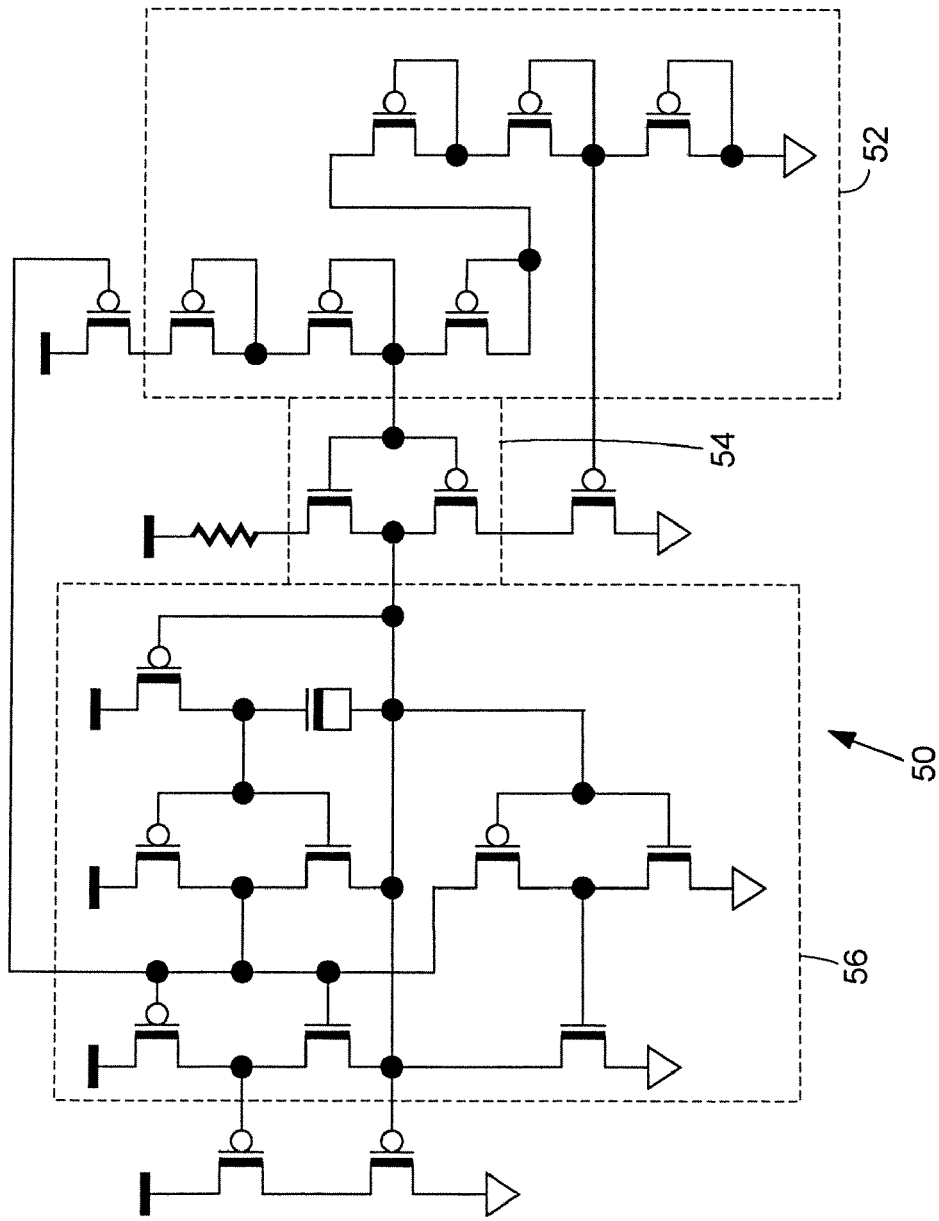
FIG. 3 illustrates another exemplary prior art implementation of a voltage tolerant clamp circuit.

Due to the use of the differential amplifier 104, the current drive of the bias voltage generator has a very wide range, generally much higher than the traditional clamping circuits disclosed above in FIGS. 2 and 3. When the load at the output of the voltage follower 106 is excessive, for example under burn-in conditions, the input voltage to the voltage follower 106 can float to as high as the output of the differential amplifier 104 can allow. On the other hand, under conditions that result in low leakage, such as low temperature or slow process corner, the input voltage to the voltage follower 106 can also float back to a lower level. Such flexibility in the input voltage to the voltage follower 106 is as a result of the use of the differential amplifier 104. The traditional clamping circuits of FIGS. 2-3 do not provide such flexibility. Thus the use of the differential amplifier 104 allows the clamping circuit 100 to provide an accurate voltage reference under a diverse range of operating conditions.

The voltage follower 106 is made of transistors 140-144 and is connected to the supply 146 via a variable resistor 148. Whereas, the controller 108 is made of a number of transistors 150-164 and a resistor (not shown in FIG. 5). Finally the current sinking device 110 includes transistors 170 and 172. Design of the differential amplifier 104, the voltage follower 106 and the controller 108 is well-known to those of ordinary skill in the art and therefore is not discussed here in further detail.

To ensure that the addition of the differential amplifier 104 does not have a negative effect on the functionality of the clamping circuit 100, it is important to make sure that the tendency of the voltage follower transistor 140 to impose a reference voltage on the mid-node 180 does not overcome the ability of the controller transistor 164 to turn on the transistor 172 of the ESD clamping 110. This is accomplished by making the channel width of the voltage follower transistor 140 small compared to the channel width of the controller transistor 164, so that the controller transistor 164 is always able to turn on the current sinking device transistor 172. As a result, during steady state and normal operation, the controller transistor 164 is off and the voltage follower transistor 142 is in control.

An alternate solution for reducing the strength of the voltage follower transistor 140 during an ESD event is using the pass gate transistor 124 at the top of the voltage divider 102, which can be turned off during an ESD event such that the gate voltage on the differential amplifier transistor 136 is reduced. Yet another embodiment of the clamping circuit 100 may have a capacitor connected between the gate of the differential amplifier transistor 136 and ground such that the gate voltage of the differential amplifier transistor 136 stays low throughout an ESD event.

Figure 6:
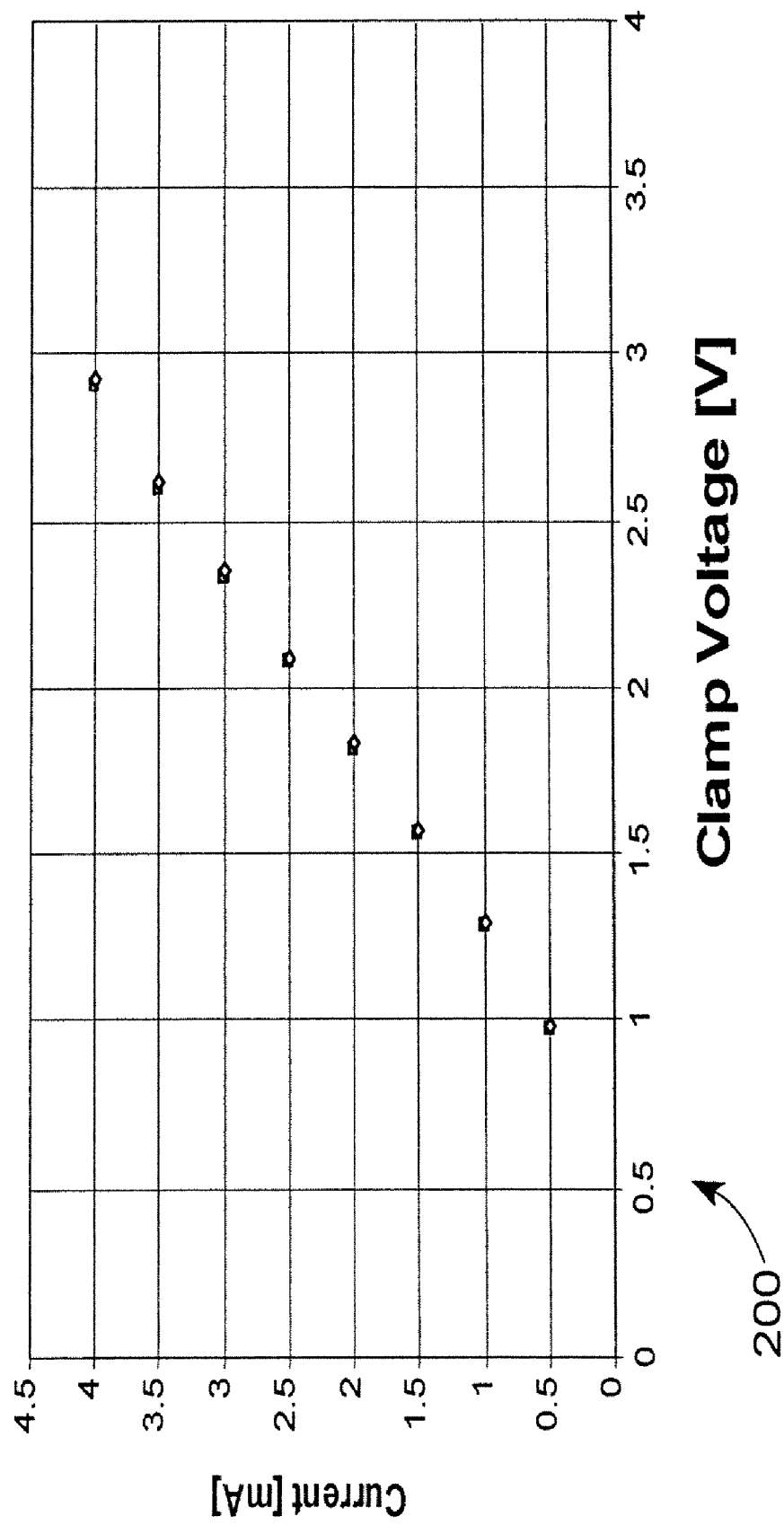
FIG. 6 illustrates a simulated pulsed current-voltage characteristic of the clamp circuit of FIG. 5.

In each of the various embodiment discussed above, it is required that any of the changes above does not affect the performance of the clamping circuit 100 during an ESD. Results of simulations for the embodiment of the clamping circuit 100 illustrated in FIG. 5 are illustrated in the graph 200 shown in FIG. 6. Specifically the graph 200 depicts the relationship between the clamp voltage and clamp current for a clamping circuit with the differential amplifier (modified clamp) and without the differential amplifier (unmodified clamp). As it can be seen by the graph 200, there is no deterioration in the performance of the clamp circuit 100 having the differential amplifier 104 as compared to a clamp circuit without a differential amplifier.

Results of simulations, including voltage at the mid-node 180, oxide lifetime of the clamping circuit 100 and leakage data for the clamping circuit 100 under various operating conditions show that the clamping circuit 100 clearly offers greater control over the voltage at the mid-node 180 across a wide range of operating conditions, including under conditions of high-voltage and high temperature. For example, under operating conditions having a voltage of 3.08 V and temperature of 125° C., the clamping circuit 100 results in a deviation of only 21.5 mV, compared to much higher deviations of 158.7 mV and 106 mV for the clamping circuits 20 and 50, respectively. The lower deviation of mid-node voltage allows performing time-to-failure studies for the clamping circuit 100 with higher accuracy.

Similarly, simulation results also show that on top of the advantage of the better control over the mid-node voltage, while the worst case oxide lifetimes of the clamping circuits 20 and 50 are only about 7 years, the worst case oxide lifetime of the clamping circuit 100 is close to 51 years. The increased worst case oxide lifetime also provides increased safety margin for the operation of the clamping circuit 100.

Moreover, the clamping circuit 20, even when highly leakage-optimized so as to have only about seven years of lifetime, has a significantly higher leakage than the clamping circuit 100. Simulation results also show that while the clamping circuit 50 may give slightly lower clamp current than the clamping circuit 100, the clamping circuit 50 fails the crucial criteria of providing an accurate and stable voltage reference. Note that at higher temperatures, the improvement in the leakage current, between the clamping circuits 20 and 100, is less pronounced. This reduced improvement results because at higher temperatures, the leakage of the current sinking transistors 38 and 40 of the clamping circuit 20 dominates the leakage of the voltage divider 22, whereas the leakage of the transistors 170 and 172 of the clamping circuit 100 dominates the leakage of the voltage divider 102.

However, for leakage sensitive application, such as battery operated real-time clock service, etc., minimizing the leakage at the room temperatures is often necessary in order to meet product specifications, and the clamping circuit 100 provides more flexibility in meeting such requirements. Furthermore, as described above, the clamping circuits 20 and 50 are highly vulnerable to process changes, whereas the clamping circuit 100 is less sensitive in this regard, such that the clamping circuit 100 designed for high performance 90 nm process can also be used in a low power 90 nm process. On the other hand, while the clamping circuit 20 that is designed for the high performance 90 nm process can be used for a low power 90 nm process, in this case the voltage divider 22 of the clamping circuit 20 will be highly over-designed when used in a low-leakage process such as a low power 90 nm process. Moreover, a process change that increases transistor leakage and/or reduces the current drive in a voltage divider results in reduced oxide lifetimes for clamping circuits 20 and 50. Compared to that, the clamping circuit 100 having a stronger voltage reference has a much better chance of surviving routine process changes.

Figure 7:
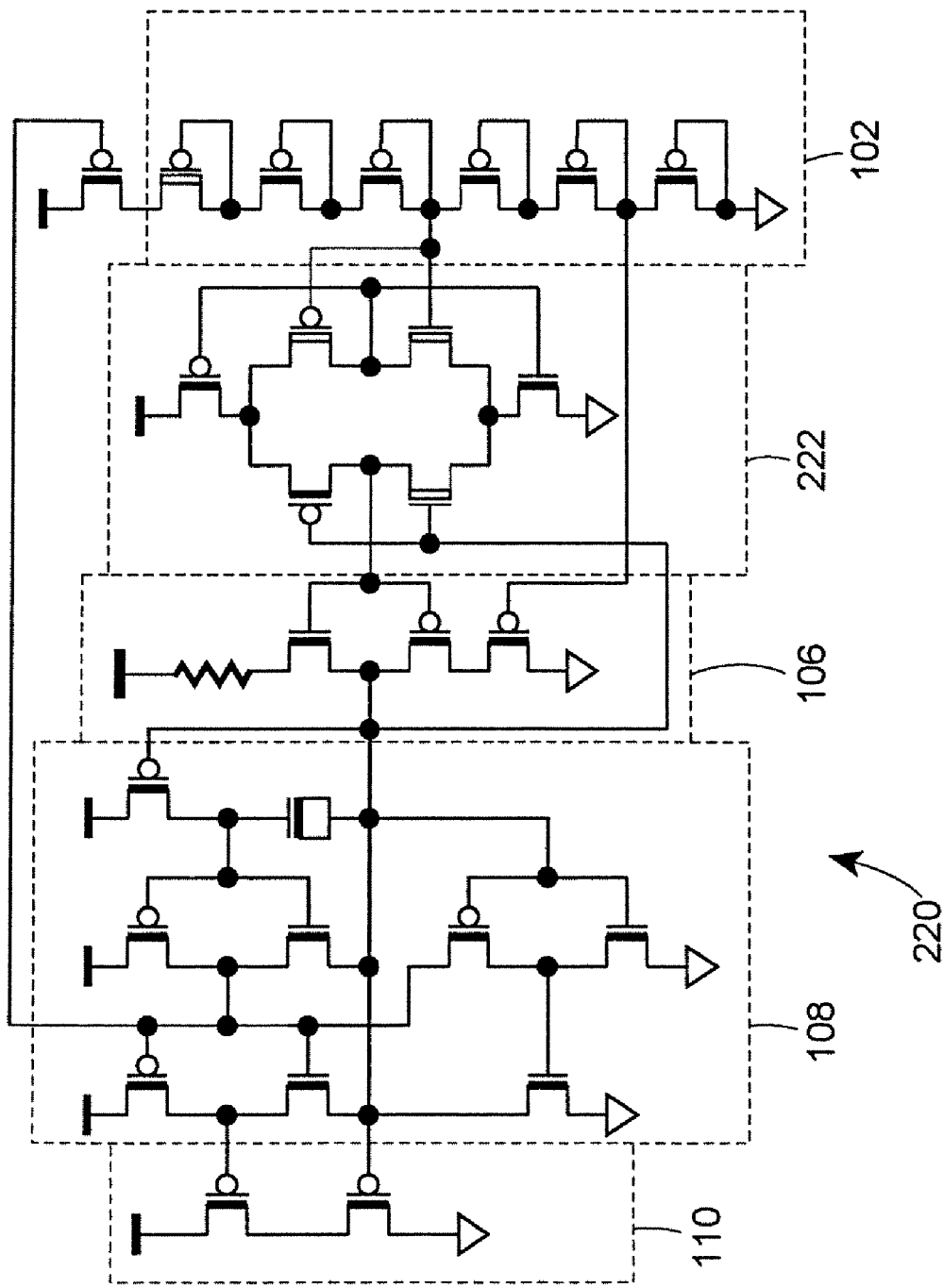
FIG. 7 illustrates an exemplary circuit diagram of a two-stack clamp circuit with complementary self-biased differential amplifier.

While the above implementation of the clamping circuit 100 uses a simple active-load differential amplifier 104 as a gain element, any other style of differential amplifier that offers a high gain and low leakage can be used. FIG. 7 illustrates an example of a clamping circuit 220 using a complementary self-biased differential amplifier 222 connected between the voltage divider 102 and the voltage follower 106. Note that other types of differential amplifiers, such as cascaded amplifier, etc., also can be used to increase the gain.

Figure 8:
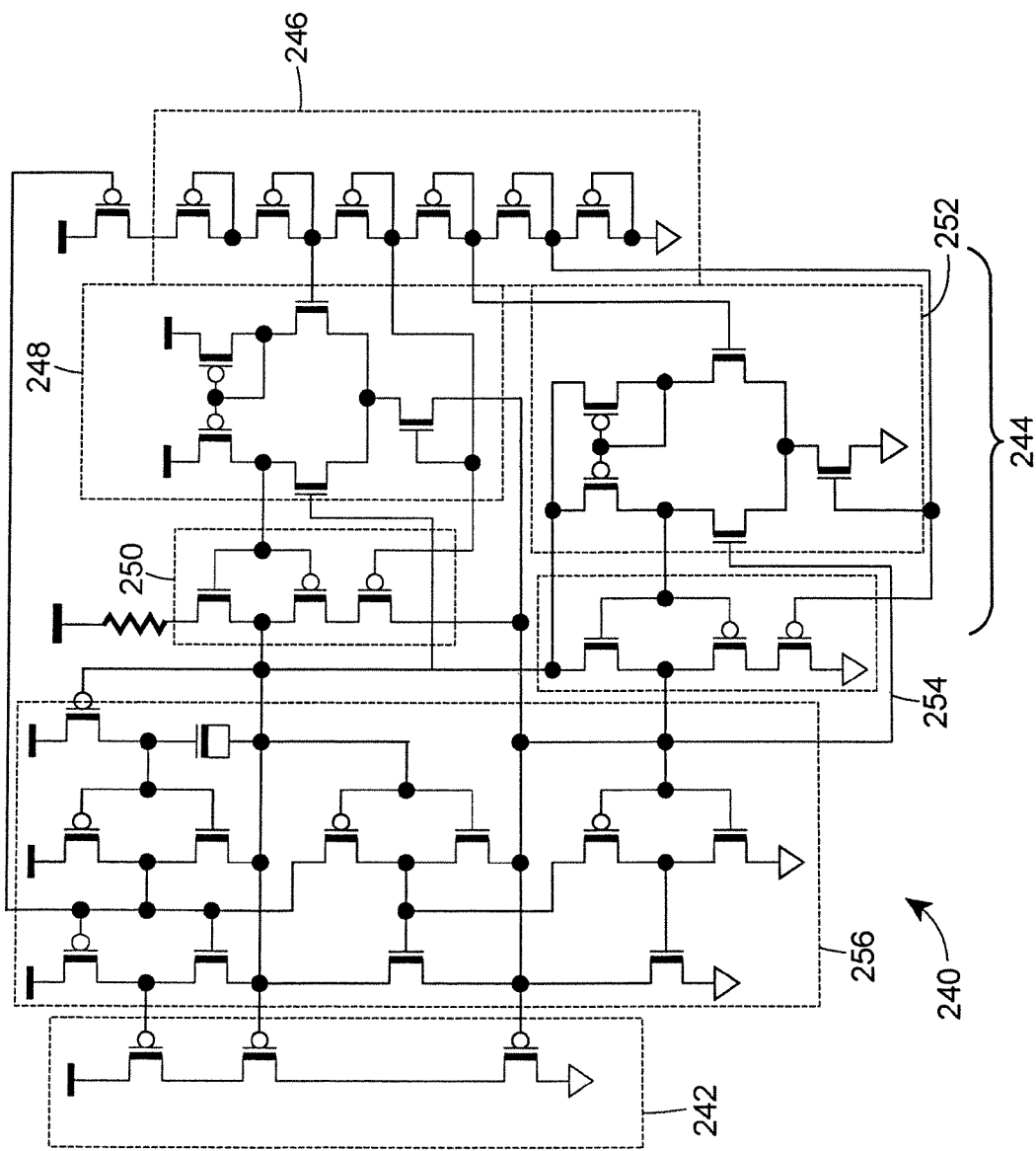
FIG. 8 illustrates an exemplary circuit diagram of a three-stack clamp circuit with improved bias voltage generation.

While the different implementations of clamping circuits 20, 50, 100 and 220 illustrated in FIGS. 2, 3, 5 and 7 use a two stack clamp, such as the current sinking device 110, these clamping circuits can be easily generalized using multi-stack current sinking devices. As an example, FIG. 8 discloses a clamping circuit 240 having a three stack current sinking device 242 and a bias voltage generator 244, where the bias voltage generator 244 includes a common voltage divider 246, a first differential amplifier 248 along with a first voltage follower 250 that provides bias voltage to one stack and a second differential amplifier 252 along with a second voltage follower 254 that provides bias voltage to another stack of the three stack current sinking device 242. The clamping circuit 240 also includes a controller circuit 256 that connects the first voltage follower 250 and the second voltage follower 254 to the three stack current sinking device 242.

The descriptions of the clamping circuits 20, 50, 100, 220 and 240 illustrated in FIGS. 2, 3, 5, 7 and 8 are made in the context of a 180 nm technology devices. Starting with a 130 nm technology devices, which is increasingly popular in the industry, the phenomenon of gate leakage has become significant. Generally, gate leakage can be described as the leakage between the gate and drain of a transistor device due to high electric field under the gate and drain overlap region of transistor device, which results in a band-to-band tunneling effect. It has been projected that the gate leakage effect in integrated circuit devices will become comparable to sub-threshold leakage in the near future.

In light of such a possibility, it is necessary to re-analyze the circuits described above to reconsider the effects of the gate leakage current on the current load that the bias voltage generators of clamping circuits need to handle. For example, considering the clamping circuit 20 of FIG. 2, the largest new addition to the current load on the voltage divider 22 is the gate-to-source leakage through the current sinking transistor 40, which adds to the existing sub-threshold leakage of the controller transistor 34. If the gate leakages of each of the transistors 34 and 40 are comparable to their sub-threshold leakages, because of the considerably larger size of the current sinking transistor 40 compared to the controller transistor 34, the gate current through the current sinking transistor 40 will in fact dwarf the leakage through the controller transistor 34. There are also the gate leakages through the control transistors 34 and 42 that affect the current load, however, they are small compared to the gate leakage of the device 40, again due to the relatively larger size of the current sinking transistor 40. Each of these gate leakages will increase the current drive requirement of the voltage divider 22, much of which is used unproductively by the device 26 of the voltage divider 22.

Furthermore, while the gate leakage of the current sinking transistor 40 is spread across a larger device, the same amount of current, plus the unproductive current through the device 26, all need to go through the relatively small device 24. The resultant density of the current through the device 24 may be high enough to require a designer of the voltage divider 22 to consider electro-migration and other long term reliability issues. The high gate leakage of the current sinking transistor 40 along with the gate leakages of the controller transistors 34 and 42 puts a great strain on simple voltage dividers such as the voltage divider 22. Therefore, a stronger voltage reference, such as the voltage divider 102 of the FIG. 5, is desired.

While there is a large amount of gate-to-drain current through the current sinking transistor 40, there is also a similar amount of gate-to-drain current leakage through the current sinking transistor 38. Thus the drain of the current sinking transistor 40 supports not only the sub-threshold leakage of the current sinking transistor 40, but two doses of gate-to-drain leakage currents, namely those of the current sinking transistor 38 and the current sinking transistor 40. Thus, if one were to be able to direct the gate-to-drain leakage current of the current sinking transistor 38 to the gate of the current sinking transistor 40, then the drain of the current sinking transistor 40 will only need to support the sub-threshold leakage of only one dose of gate-to-drain leakage, namely that of the current sinking transistor 40. This can be done in practice by connecting either a resistor or a pass-FET between the drain of the current sinking transistor 38 and the gate of the current sinking transistor 40.

Figure 9:
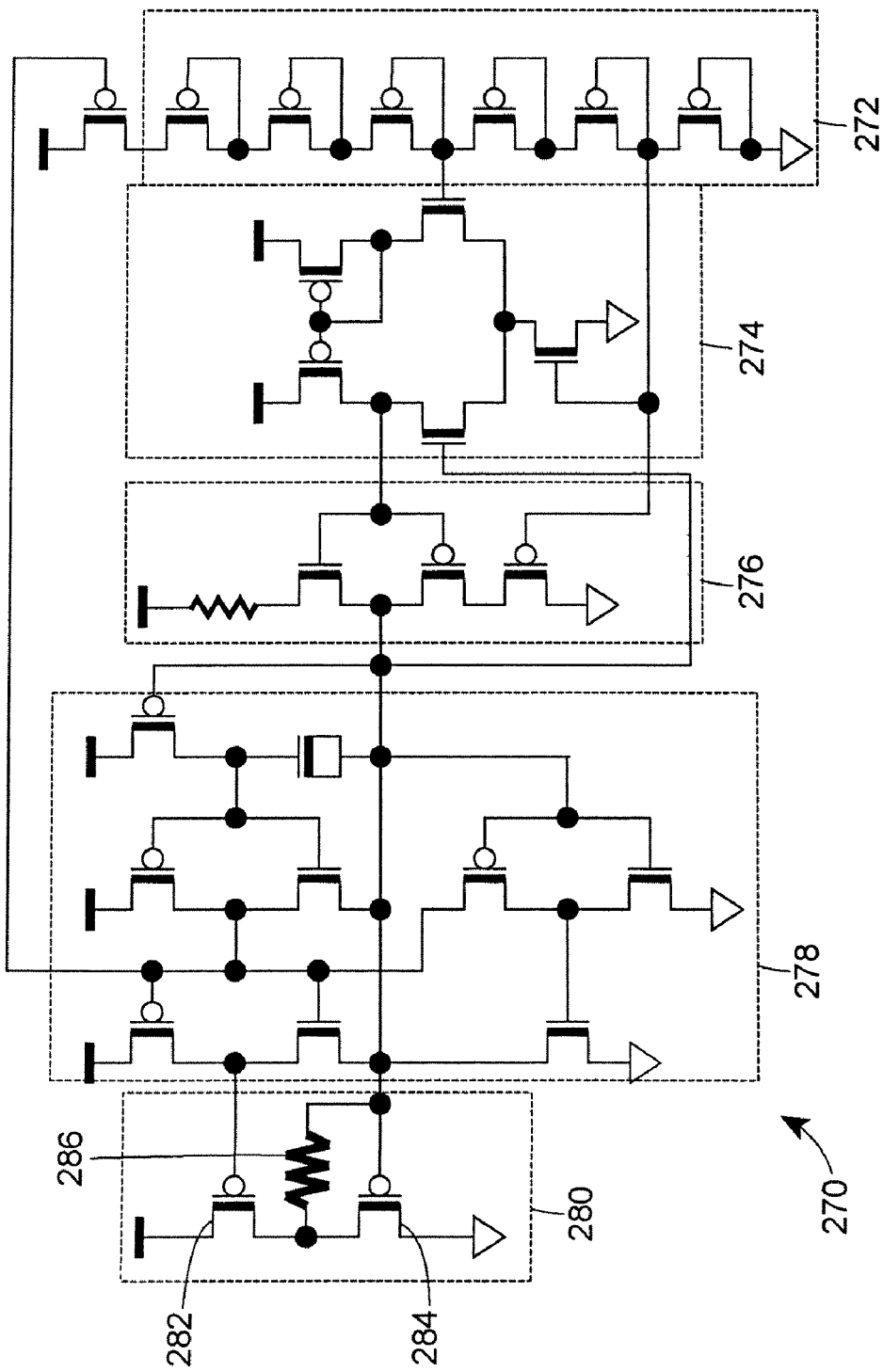
FIG. 9 illustrates an exemplary circuit diagram of a two-stack clamp circuit with a gate-leakage-diverting resistor.

FIG. 9 shows an alternate implementation of a clamping circuit 270 with a voltage divider 272, a differential amplifier 274, a voltage follower 276, a control circuit 278, and a current sinking device 280, wherein the current sinking device 280 includes a current sinking transistor 282 and a current sinking transistor 284, wherein a resistor 286 is connected between the drain of the current sinking transistor 282 and the gate of the current sinking transistor 284. The resistor 286 allows directing the gate-to-drain leakage current of the current sinking transistor 282 towards the gate of the current sinking transistor 284, thus reducing the current load on the drain of the current sinking transistor 284.

Figure 10:
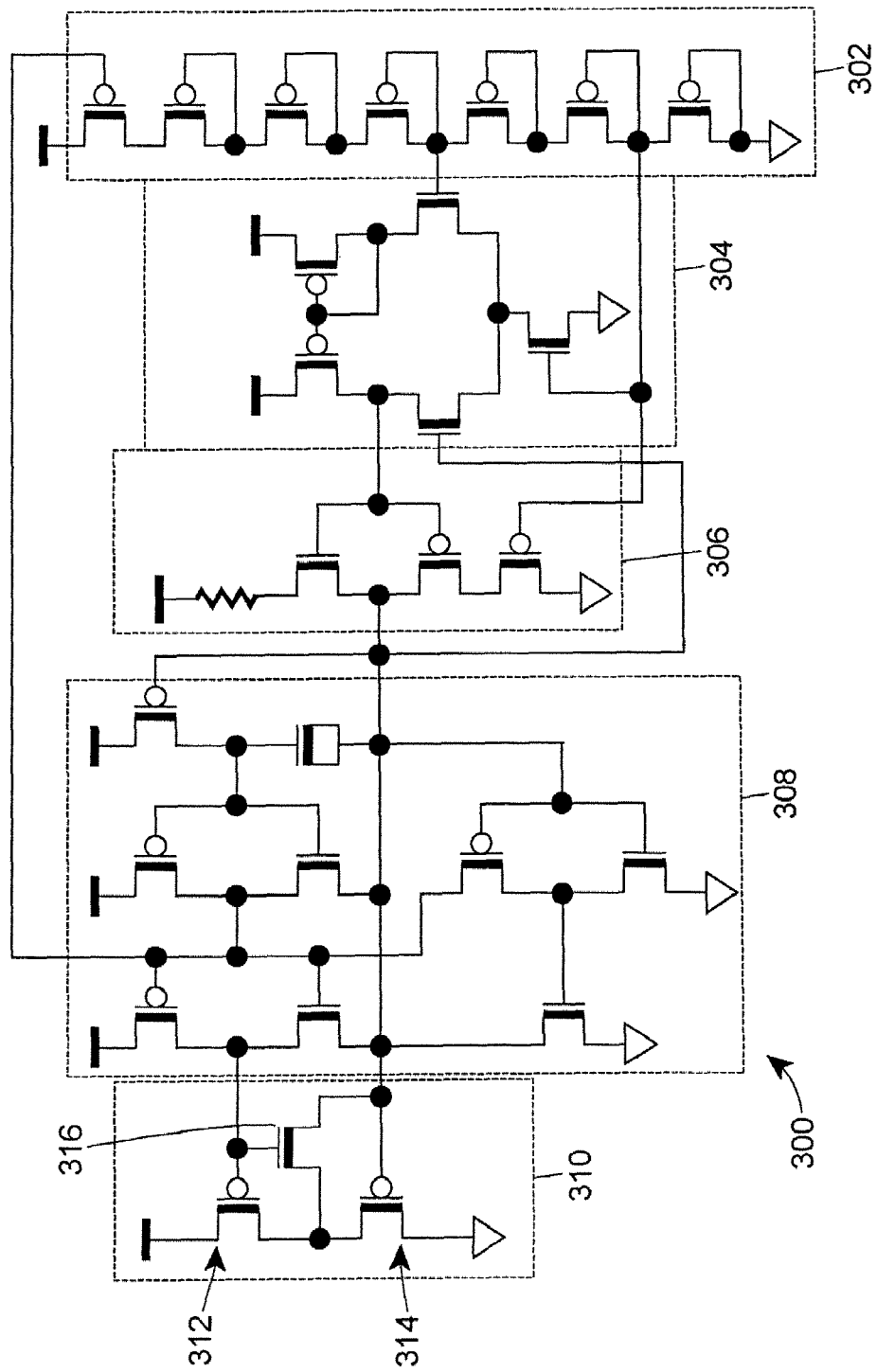
FIG. 10 illustrates an exemplary circuit diagram of a two-stack voltage tolerant clamp circuit with gate leakage-diverting pass gate.

FIG. 10 shows an alternate implementation of a clamping circuit 300 with a voltage divider 302, a differential amplifier 304, a voltage follower 306, a control circuit 308, and a current sinking device 310, wherein the current sinking device 310 includes a current sinking transistor 312 and a current sinking transistor 314 with a pass-FET 316 is connected between the drain of the current sinking transistor 312 and the gate of the current sinking transistor 314. The pass-FET 316 allows directing the gate-to-drain leakage current of the current sinking transistor 312 towards the gate of the current sinking transistor 314, thus reducing the current load on the drain of the current sinking transistor 314.

Figure 11:
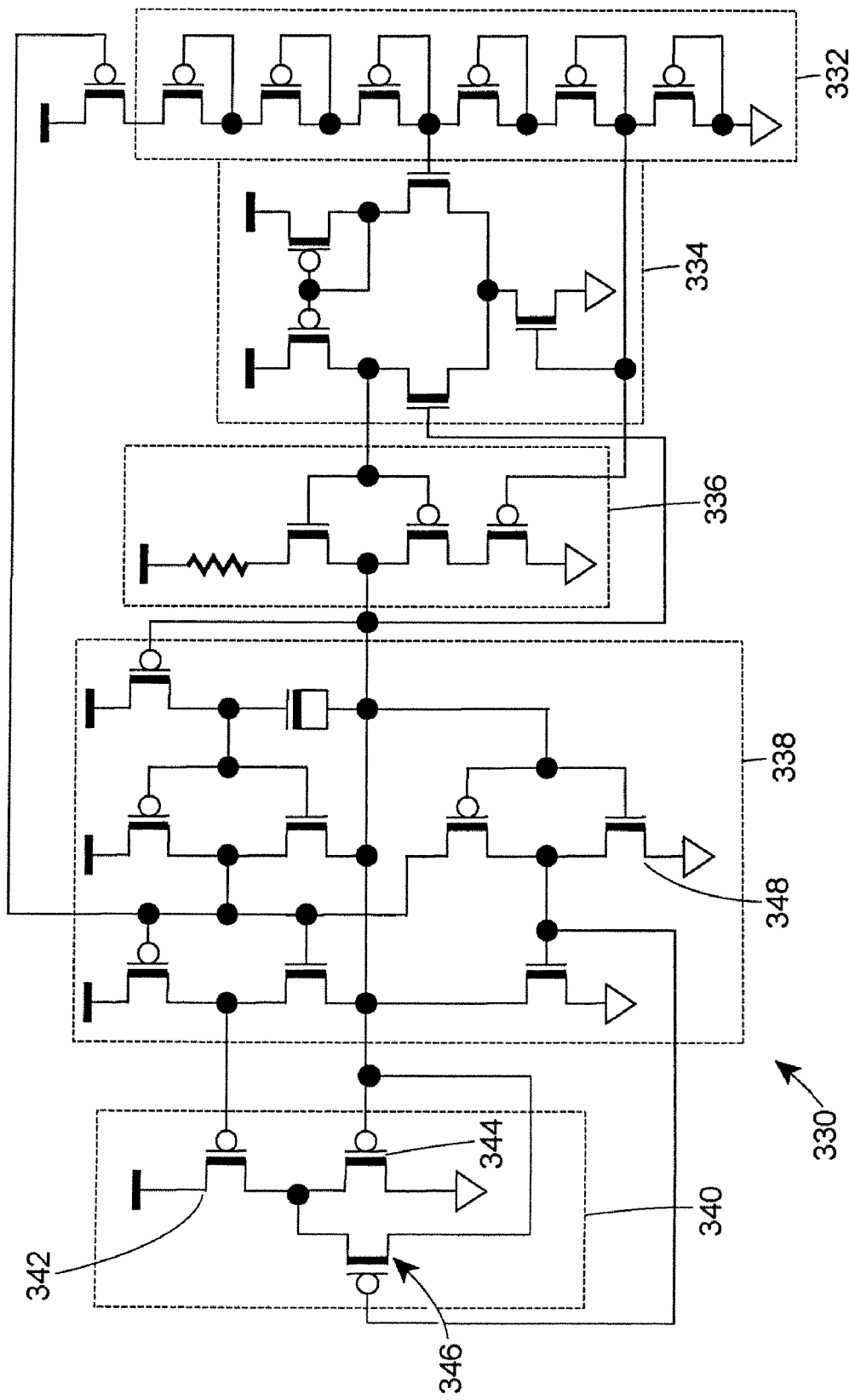
FIG. 11 illustrates an exemplary circuit diagram of a two-stack voltage tolerant clamp circuit with gate leakage-diverting PMOS.

FIG. 11 shows an alternate implementation of a clamping circuit 330 with a voltage divider 332, a differential amplifier 334, a voltage follower 336, a control circuit 338, and a current sinking device 340, wherein the current sinking device 340 includes a current sinking transistor 342 and a current sinking transistor 344. The clamping circuit 330 has a p-channel FET 346 connected between the drain of the current sinking transistor 342 and the gate of the current sinking transistor 344, wherein the gate of the p-channel FET 346 is connected either to the drain of the controller transistor 348, or to ground. The p-channel FET 346 allows directing the gate-to-drain leakage current of the current sinking transistor 342 towards the gate of the current sinking transistor 344, thus reducing the current load on the drain of the current sinking transistor 344.

The n-channel device 316, as used in the clamping circuit 300, may be susceptible to destruction or lapsing into a high-current state during snap-back. Compared to that, when using the grounded-gate p-channel FET 346 as in the clamping circuit 330, the grounded-gate p-channel FET 346 should be set in such a way that it is much weaker than the controller transistor 348. This ensures that the controller transistor 348 can overcome the grounded-gate p-channel FET 346 when the resulting clamping circuit is operating in an ESD mode. On the other hand, when the n-channel device 316 is employed as in the clamping circuit 300, it can be turned off during an ESD event, which allows using an n-channel device of arbitrary strength.

The various solutions employed to address the problem of the gate-to-drain leakage current, as shown by the clamping circuits 270, 300 and 330, also provide a very welcome benefit of reducing the load on the respective bias-voltage generators 272, 302 and 332. This is as a result of supplying the gate leakage of the current sinking transistors 284, 314 and 344 via the current sinking transistors 282, 312 and 342, respectively, instead of via the respective voltage references of each of these clamping circuits.

The solutions described above are generally optimized for gate leakage so that the entire amount of the gate current through the current sinking transistors 282, 312 and 342 is diverted to the gate of the current sinking transistors 284, 314 and 344, respectively. However, because the gate-to-source voltage of the current sinking transistors 284, 314 and 344 is non-zero due to body effect, if each of the pairs 282 and 284, 312 and 314, and 342 and 344 are contained in the same well, then it is possible to divert more than optimized current to the current sinking transistors 284, 314 and 344. As a result, overshooting results in a decrease in the gate leakage and an increase in the sub-threshold leakage for the current sinking transistors 284, 314 and 344, and depending on the ratio of the gate leakage current and the sub-threshold leakage of the technology used, the solutions described above may or may not result in current savings. Nonetheless, the benefit of reducing the load on the voltage references 272, 302 and 332 as described above still stands.

In an alternate scenario, where each of the pairs 282 and 284, 312 and 314, and 342 and 344 are contained in different wells with bulk shorted to the source of each of the current sinking transistors, the sub-threshold leakages will be minimized when gate-to-source voltages of the current sinking transistors 274, 304 and 334 are zero. In this scenario, the solutions described above will only have beneficial effects for circuits 270, 300 and 330.

Simulation results have shown that the addition of the pass-FET 316, as shown in FIG. 10, reduces the current load on the voltage reference 302 by a significant amount. This is because the pass-FET 316 provides most of the gate current through the current sinking transistor 314.

While the strongest justification for incorporating the pass-FET 316 in the clamping circuit 300 or the resistor 286 in the clamping circuit 270 lies in the increased accuracy of and reduced reliability concerns for the voltage references of the respective clamping circuits 300 and 270, these changes also result in reduced overall current. For example, simulation results have shown that the reduction in the total current in the clamping circuit 300 as a result of using the pass-FET 316 is in the order of thirty percent.

Figure 12:
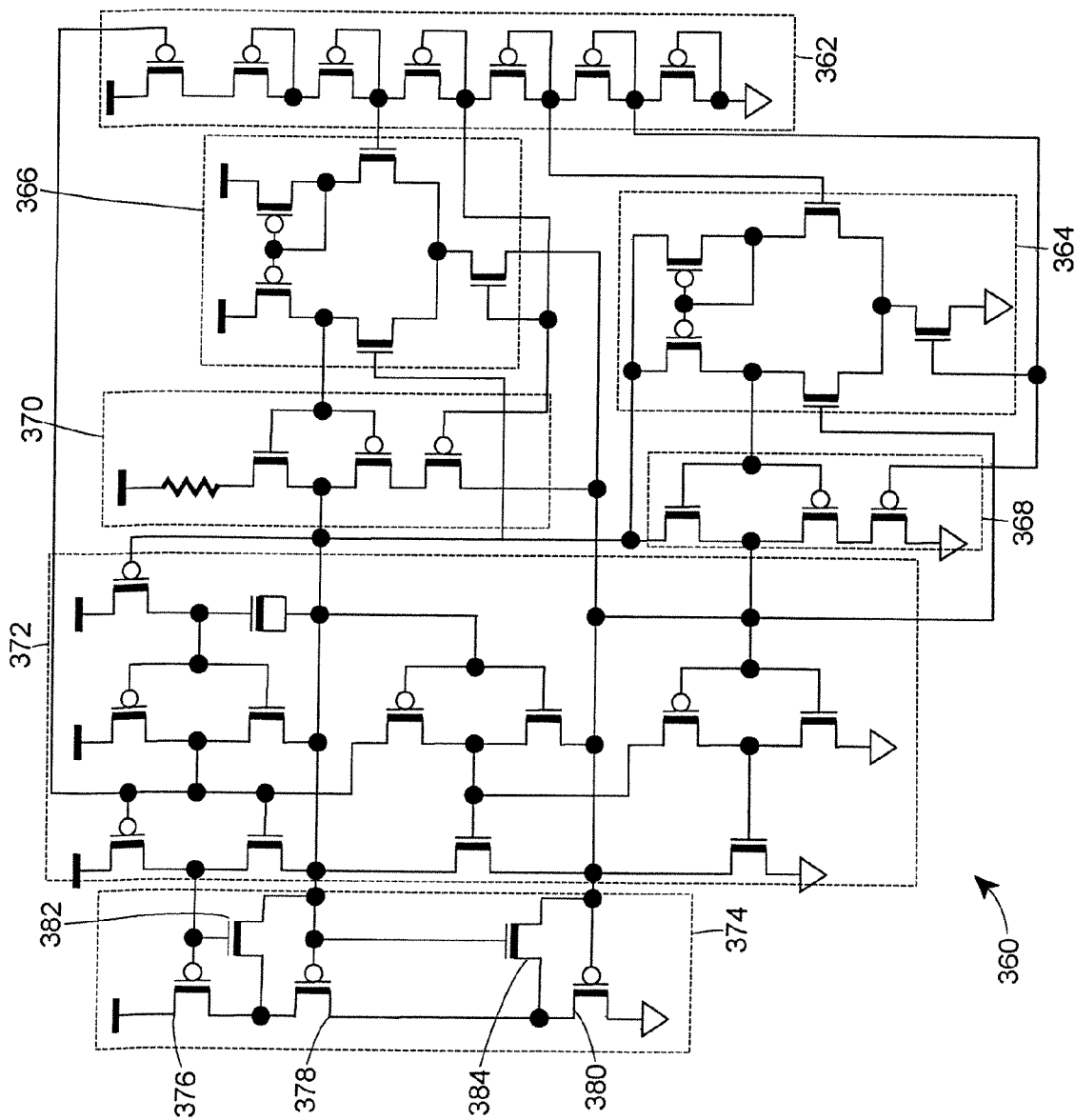
FIG. 12 illustrates an exemplary circuit diagram of a three-stack voltage tolerant clamp circuit with gate leakage-diverting PFETs.

As discussed earlier, while the above implementations of clamping circuits 270, 300 and 330 are shown using two-stack current sinking devices 280, 310 and 340, these clamping circuits can also be implemented using multi-stack current sinking devices. FIG. 12 illustrates an implementation of a clamping circuit 360 using a three stack current sinking device 374 using a load reducing technique similar to the one employed in the clamping circuit 300. More specifically the clamping circuit 360 employs a voltage divider 362 that provides a set of voltage references, differential amplifiers 364 and 366, voltage followers 368 and 370, a control circuit 372, and a three stack current sinking device 374. The three-stack current sinking device 374 includes current sinking transistors 376, 378 and 380, wherein a first pass-FET 382 connected between the drain of the current sinking transistor 376 and the gate of the current sinking transistor 378, and a second pass-FET 384 connected between the drain of the current sinking transistor 378 and the gate of the current sinking transistor 380.

Because each of the current sinking transistors 376, 378 and 380 needs its own gate current, the three-stack current sinking device 374 without the proposed pass-FET devices 382 and 384 will need three doses of gate current, whereas the proposed current sinking device 374 with the pass-FET devices 382 and 384 needs only one dose of gate current, resulting in reduction of total clamping load current. As it will be obvious to one of ordinary skill in the art, the benefit of reduced clamp load current can be extrapolated to an n-stack clamping circuit, where instead of n doses of gate current, only one dose of gate current is required in the n-stack current sinking device using pass-FETs to connect drain of first n−1 current sinking transistors to the gates of the following n−1 current sinking transistors.

Although the forgoing text sets forth a detailed description of numerous different embodiments, it should be understood that the scope of the patent is defined by the words of the claims set forth at the end of this patent. The detailed description is to be construed as exemplary only and does not describe every possible embodiment because describing every possible embodiment would be impractical, if not impossible. Numerous alternative embodiments could be implemented, using either current technology or technology developed after the filing date of this patent, which would still fall within the scope of the claims of this patent.

Thus, many modifications and variations may be made in the techniques and structures described and illustrated herein without departing from the spirit and scope of the present patent. Accordingly, it should be understood that the methods and apparatus described herein are illustrative only and are not limiting upon the scope of the patent.

What is claimed is:

1. An apparatus comprising:
   first circuitry to control sinking of current from a power supply node to a lower potential node in response to an electrostatic discharge event on the power supply node, the circuitry having a control node for controlling sinking operation; and
   second circuitry to generate a reference voltage, to buffer the reference voltage through a low impedance output, to regulate the buffering of the reference voltage by a negative feedback, and to apply the reference voltage to the control node.

2. The apparatus of claim 1, wherein the first circuitry includes circuitry to sink the current from the power supply to the lower potential node and circuitry to couple the control node to the lower potential node such that during the electrostatic discharge event on the power supply node a voltage drop from the control node to the ground potential is less than a threshold voltage of a load transistor.

3. The apparatus of claim 1, wherein the second circuitry includes third circuitry to generate the reference voltage by dividing a voltage on the power supply node.

4. The apparatus of claim 3, wherein the third circuitry includes a low leakage voltage divider circuit.

5. The apparatus of claim 3, wherein the second circuitry further includes fourth circuitry to function as a voltage follower circuit to present the low output impedance to the third circuitry.

6. The apparatus of claim 5, wherein the second circuitry includes fifth circuitry to receive a first input from the third circuitry and a second input from the fourth circuitry, and wherein the fifth circuitry is adapted to drive up an input voltage to the fourth circuitry in a manner so that the first input and the second input are at the same potential.

7. The apparatus of claim 6, wherein the fifth circuitry includes circuitry to function as a differential amplifier circuit in a negative feedback configuration to set the output voltage which is of the fourth circuitry.

8. The apparatus of claim 1, wherein the second circuitry includes circuitry to apply the reference voltage to the control node under a burn-in condition, a low leakage condition, and under the electrostatic discharge event.

9. The apparatus of claim 1, wherein the first circuitry includes circuitry to function as a plurality of series coupled p-type complementary metal oxide semiconductor (CMOS) transistors.

10. The apparatus of claim 9, wherein the first circuitry includes a first p-type sinking transistor and a second p-type sinking transistor with the source of the first p-type sinking transistor connected to the power supply node, the drain of the first p-type sinking transistor connected to the source of the second p-type sinking transistor, the drain of the second p-type sinking transistor connected to the ground and the gate of the second p-type sinking transistor being the control node.

11. The apparatus of claim 9, wherein the first circuitry includes a first p-type sinking transistor, a second p-type sinking transistor and a third p-type sinking transistor, and wherein the source of the first p-type sinking transistor is connected to the power supply node, the drain of the first p-type sinking transistor is connected to the source of the second p-type sinking transistor, the drain of the second p-type sinking transistor connected to the source of the third p-type sinking transistor, the drain of the third p-type sinking transistor connected to the ground and the gate of the third p-type sinking transistor connected to the control node.

12. A method comprising:
   providing a current sinking circuitry between a power supply node and a lower potential node;
   generating a reference voltage; and
   buffering the reference voltage through a buffer, controlling the buffering through a negative feedback circuit coupling the reference voltage to the buffer, and applying the reference voltage from the buffer to a control node of the current sinking circuit to couple the control node to a ground potential during an electrostatic discharge event.

13. The method of claim 12, wherein the current sinking circuitry comprises a switchable current sinking circuit including a plurality of series coupled p-type complementary metal oxide semiconductor (CMOS) transistors.

14. The method of claim 12, wherein generating the reference voltage comprises generating the reference voltage by dividing a voltage on the power supply node for coupling the reference voltage to the buffer having an input and an output.

15. The method of claim 14, further comprising setting a voltage drop across the buffer by providing a differential amplifier circuit to the input of the buffer.

16. The method of claim 15, further comprising driving up the input to the buffer until two inputs to the differential amplifier circuit are at a same potential.

17. The method of claim 12, wherein applying the reference voltage comprises applying the reference voltage to the control node under a burn-in condition, a low leakage condition, and under the electrostatic discharge event.

18. The method of claim 12, further comprising coupling the reference voltage through low leakage current circuitry.

19. The method of claim 12, wherein the buffer is a voltage follower circuit adapted to present a low output resistance and low leakage current.

* * * * *

UNITED STATES PATENT AND TRADEMARK OFFICE
CERTIFICATE OF CORRECTION

| | |
|---|---|
| PATENT NO. | : 7,483,247 B2 |
| APPLICATION NO. | : 11/734531 |
| DATED | : January 27, 2009 |
| INVENTOR(S) | : Steven S. Poon et al. |

It is certified that error appears in the above-identified patent and that said Letters Patent is hereby corrected as shown below:

On the Title Page:

At field (*), add -- This patent is subject to a terminal disclaimer. --.

Signed and Sealed this

Fourteenth Day of April, 2009

JOHN DOLL
*Acting Director of the United States Patent and Trademark Office*